United States Patent
Hosaka et al.

(10) Patent No.: US 11,041,257 B2
(45) Date of Patent: Jun. 22, 2021

(54) SHIELDING MEMBER INCLUDING A PLURALITY OF SHIELDING PLATES ARRANGED WITHOUT GAPS THEREBETWEEN IN PLAN VIEW AND APPARATUS FOR GROWING SINGLE CRYSTALS

(71) Applicant: SHOWA DENKO K.K., Tokyo (JP)

(72) Inventors: Yoshiteru Hosaka, Hikone (JP); Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 90 days.

(21) Appl. No.: 16/391,566

(22) Filed: Apr. 23, 2019

(65) Prior Publication Data
US 2019/0338444 A1    Nov. 7, 2019

(30) Foreign Application Priority Data
May 1, 2018    (JP) .............................. JP2018-088247

(51) Int. Cl.
*C30B 35/00* (2006.01)
*C30B 23/06* (2006.01)
*C30B 29/36* (2006.01)

(52) U.S. Cl.
CPC .......... *C30B 35/002* (2013.01); *C30B 23/066* (2013.01); *C30B 29/36* (2013.01)

(58) Field of Classification Search
CPC ..... C30B 23/00; C30B 23/002; C30B 23/005; C30B 23/02; C30B 23/06; C30B 23/063; C30B 23/066; C30B 29/00; C30B 29/10; C30B 29/36; C30B 35/00; C30B 35/002

USPC ................... 117/84, 106, 200, 204, 937, 951
See application file for complete search history.

(56) References Cited

FOREIGN PATENT DOCUMENTS

| JP | 11-255597 A | | 9/1999 |
|---|---|---|---|
| JP | 2000-264795 A | | 9/2000 |
| JP | 2000264795 A | * | 9/2000 |
| WO | 2011/105123 A1 | | 9/2011 |

OTHER PUBLICATIONS

Office Action dated Nov. 25, 2020 from the China National Intellectual Property Administration in CN Application No. 201910311630.3.

* cited by examiner

*Primary Examiner* — Kenneth A Bratland, Jr.
(74) *Attorney, Agent, or Firm* — Sughrue Mion, PLLC

(57) ABSTRACT

A shielding member includes a plurality of shielding plates, in which the plurality of shielding plates are arranged without gaps therebetween in a plan view from a crystal installation part, and the shielding member is disposed between a source material accommodation part and the crystal installation part, in an apparatus for growing single crystals, wherein the apparatus includes a container for crystal growth that has the source material accommodation part at an inner bottom part, and has the crystal installation part that faces the source material accommodation part, and includes a heating part that is configured to heat the container for crystal growth, in which a single crystal of the source material is grown on a crystal installed in the crystal installation part by subliming the source material from the source material accommodation part.

14 Claims, 6 Drawing Sheets

(a)

(b)

(c)

(a)

(b)

(c)

SHIELDING MEMBER INCLUDING A PLURALITY OF SHIELDING PLATES ARRANGED WITHOUT GAPS THEREBETWEEN IN PLAN VIEW AND APPARATUS FOR GROWING SINGLE CRYSTALS

BACKGROUND OF THE INVENTION

Field of the Invention

The present disclosure relates to a shielding member and an apparatus for growing single crystals.

Priority is claimed on Japanese Patent Application No. 2018-088247, filed May 1, 2018, the content of which is incorporated herein by reference.

Description of Related Art

Silicon carbide (SiC) has a dielectric breakdown electric field which is one digit larger and has a band gap three times that of silicon (Si). In addition, silicon carbide (SiC) has characteristics in which thermal conductivity is about three times that of silicon (Si), for example. Silicon carbide (SiC) is expected to be applied to power devices, high frequency devices, high-temperature operation devices, and the like.

A SiC epitaxial wafer in which an epitaxial film is formed on a SiC wafer is used for a device such as a semiconductor. An epitaxial film provided on a SiC wafer by chemical vapor deposition (CVD) is an active region of a SiC semiconductor device. A SiC wafer is obtained by processing a SiC ingot.

A SiC ingot is obtained by allowing crystal growth of a seed crystal by a method such as sublimation recrystallization. When a temperature difference is generated between a source material and a growth surface in the sublimation method, a source material gas sublimed from the source material is efficiently supplied to the growth surface, and therefore crystal growth is promoted. However, the growth surface faces the source material and receives radiation from the source material. For this reason, it has been difficult to cause a temperature difference to be generated between a source material and a growth surface.

Patent Document 1 discloses that a shielding member is provided between a source material and a growth surface. The shielding member curbs radiation from the source material to the growth surface, and therefore a temperature difference is generated between the source material and the growth surface.

Patent Documents

Patent Document 1: Japanese Unexamined Patent Application, First Publication No. 2000-264795

SUMMARY OF THE INVENTION

In recent years, a demand for large-size (6 inches or more) SiC wafers has increased. For example, in order to produce a large-size SiC ingot by using the shielding member disclosed in Patent Document 1, it is necessary to use a shielding member having a large diameter. However, the shielding member having a large diameter inhibits flow of a source material gas. When the source material gas becomes more difficult to supply to a central part of a growth surface, homogeneous crystal growth is inhibited.

The present disclosure has been made in view of the above problems. The present disclosure provides a shielding member by which inhibition of flow of a source material gas can be curbed, and by which a temperature difference between a source material surface and a growth surface can be generated; and an apparatus for growing single crystals which includes this shielding member.

The inventors of the present disclosure have found that, by disposing a plurality of shielding plates without gaps therebetween in a plan view, it is possible to efficiently curb radiation from a surface of a source material while securing gaps between shielding plates as a flow path of a source material gas.

That is, the present disclosure provides the following means to solve the above problems.

(1) A shielding member according to a first embodiment comprises a plurality of shielding plates, in which the plurality of shielding plates are arranged without gaps therebetween in a plan view from a crystal installation part, and the shielding member is disposed between a source material accommodation part and the crystal installation part, in an apparatus for growing single crystals which comprises a container for crystal growth that includes the source material accommodation part at an inner bottom part, and includes the crystal installation part that faces the source material accommodation part, and which comprises a heating part that is configured to heat the container for crystal growth, in which a single crystal of a source material is grown on a crystal installed in the crystal installation part by subliming the source material from the source material accommodation part.

The shielding member according to the first embodiment preferably includes the following characteristics. It is also preferable to combine one or more of the characteristics shown below.

(2) The shielding member according to the embodiment may further include a connection part that connects the plurality of shielding plates, and a support part that supports the connection part.

(3) In the shielding member according to the embodiment, the connection part may be located at a center in a plan view.

(4) In the apparatus for growing single crystals according to the embodiment, adjacent surfaces of shielding plates which are adjacent to each other among the plurality of shielding plates may be inclined with respect to a direction of a vertical line in which the vertical line is dropped from the crystal installation part to the source material accommodation part, and gaps located between the shielding plates adjacent to each other may be inclined with respect to the direction of the vertical line.

(5) In the shielding member according to the embodiment, adjacent surfaces of shielding plates which are adjacent to each other among the plurality of shielding plates may be bent or curved, and gaps located between the shielding plates adjacent to each other may be bent or curved.

(6) In the shielding member according to the embodiment, surfaces, which are on a side of the crystal installation part, of the plurality of shielding plates may be located in the same plane.

(7) An apparatus for growing single crystals according to a second embodiment includes the shielding member according to the above-described embodiment.

The apparatus for growing single crystals according to the second embodiment preferably includes one or more characteristics selected from (2) to (6).

According to the shielding member according to the above-described embodiment, it is possible to efficiently curb radiation from a surface of a source material while securing gaps between shielding plates as a flow path of a source material gas.

DETAILED DESCRIPTION OF THE INVENTION

Figure 1:
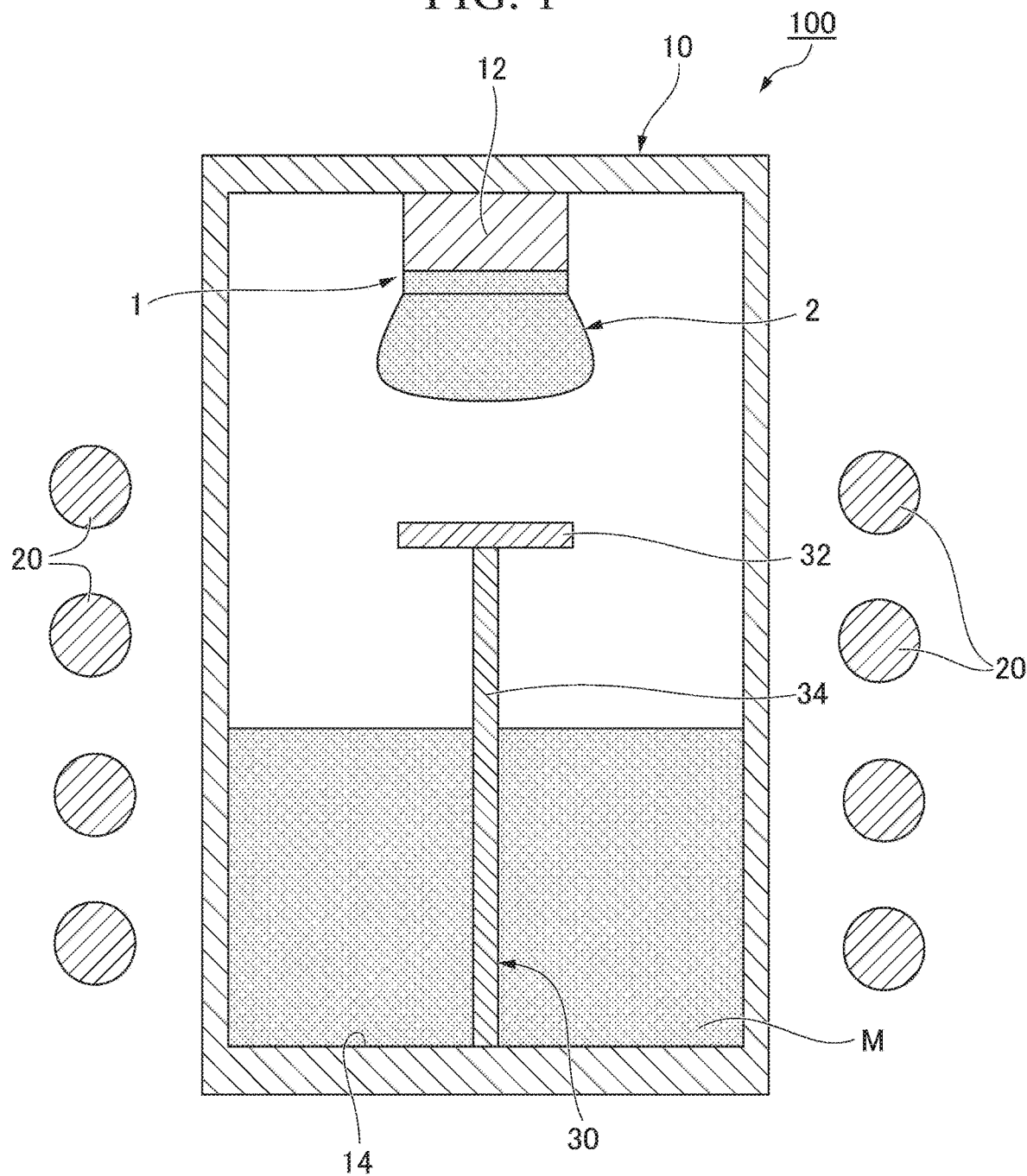
FIG. 1 is a schematic cross-sectional view showing a preferable example of an apparatus for growing single crystals according to a first embodiment.

Hereinafter, preferred examples of the present embodiment will be described in detail with reference to the drawings. In the drawings used in the following description, a main part is shown in an enlarged manner in some cases for the sake of convenience, and dimensional ratios and the like between the components may be different from actual ratios. The materials, dimensions, and the like in the following description are merely exemplary examples, and the present invention is not limited thereto, and can be appropriately changed and modified to carry out the present embodiment, within a range not changing the gist thereof. Numbers, sizes, locations, materials, ratios, shapes, and the like may be changed, added, or omitted as necessary, unless otherwise specified.

"Apparatus for Growing Single Crystals"

FIG. 1 is a schematic cross-sectional view showing a preferable example of an apparatus for growing single crystals according to a first embodiment. In FIG. 1, a source material M, a seed crystal 1, and a single crystal 2 are shown at the same time for easy understanding. An apparatus for growing single crystals 100 shown in FIG. 1 includes a container for crystal growth 10, a coil (heating part) 20, and a shielding member 30.

The container for crystal growth 10 has a space in the inside thereof. An inner bottom surface of the container for crystal growth 10 is filled with the source material M. The inner bottom surface of the container for crystal growth 10 is a source material accommodation part 14. For example, when the inner bottom surface of the container for crystal growth 10 is filled with the source material M, the source material accommodation part 14 can be formed by the inner bottom surface and a lower inner side surface. The container for crystal growth 10 includes a crystal installation part 12 at a location that faces the source material M with which the source material accommodation part 14 is filled. The crystal installation part 12 is a part in which the seed crystal 1 is installed. For example, the crystal installation part 12 cylindrically protrudes toward the source material M at a central location when viewed from a side of the source material M. A carbon material such as graphite can be used for the crystal installation part 12.

The coil 20 covers an outer periphery of the container for crystal growth 10. When a current is supplied to the inside of the coil 20, the coil 20 generates heat and functions as a heater. When the source material M is heated by the coil 20, the source material M is sublimed, and the single crystal 2 grows on a growth surface of the seed crystal 1.

The shielding member 30 is located between the source material accommodation part 14 and the crystal installation part 12. The shielding member 30 includes a shielding part 32 and a support part 34. For example, graphite, tantalum carbide, graphite coated with tantalum carbide, or the like can be used for the shielding member 30. The shielding part 32 can have a plurality of shielding plates which can be optionally selected. The number of plates may be even or odd. The number of plates may be, for example, a number within the range of 2 to 16 or 2 to 8. Specific examples thereof include 2, 3, 4, 5, 6, 8, 9, 10, and 12. However, the number of plates is not limited to these examples.

Figure 2:
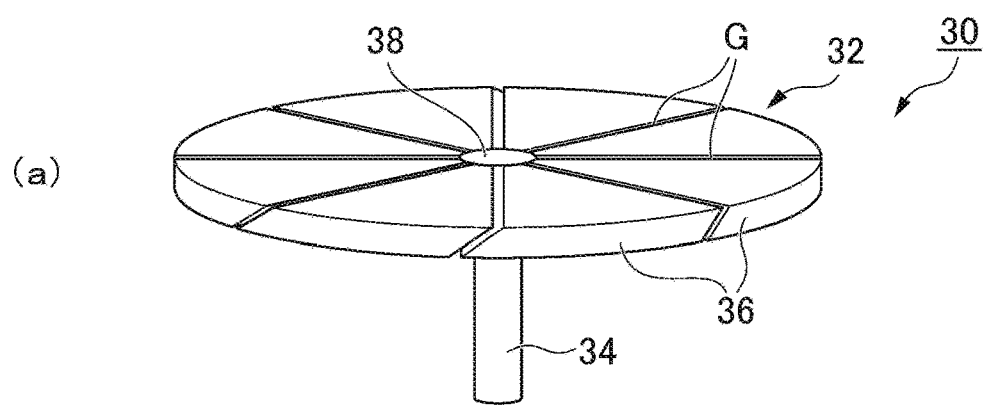
FIG. 2 is a schematic view showing a preferable example of a shielding member according to the first embodiment.
Figure 2:
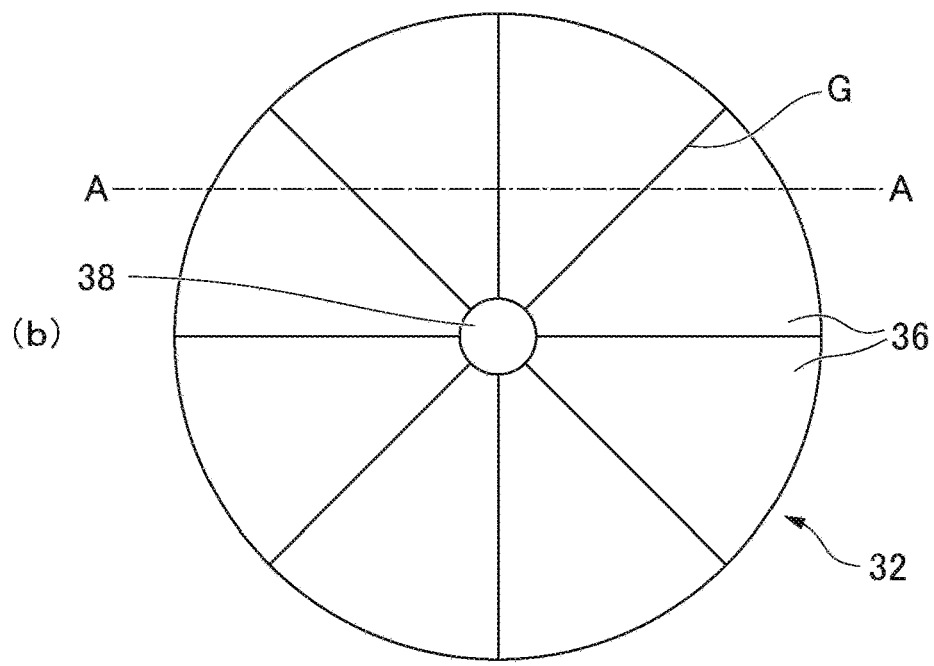
Figure 2:
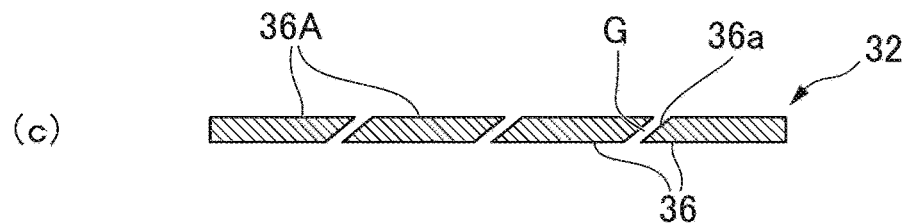

FIG. 2 is a schematic view showing a preferable example of the shielding member 30 according to the first embodiment. (a) shown in FIG. 2 is a schematic perspective view of the shielding member 30, (b) shown in FIG. 2 is a schematic plan view of the shielding part 32 of the shielding member 30, and (c) shown in FIG. 2 is a schematic cross-sectional view of the shielding part 32 of the shielding member 30 taken along a plane A-A shown in (b) of FIG. 2.

The shielding part 32 has a plurality of shielding plates 36. The shielding part 32 shown in FIG. 2 includes eight shielding plates 36, but the number of shielding plates 36 is not particularly limited. The plurality of shielding plates 36 of FIG. 2 preferably have the same shape. Each of the shielding plates 36 is substantially fan-shaped in a plan view, and preferably has two main surfaces opposite each other, one outer peripheral side surface, two side surfaces (inclined planes), and a side surface or a portion connected to a connection part 38. The plurality of shielding plates 36 are connected to the connection part 38 located at a center in a plan view, and the connection part 38 is supported by the support part 34. Integration of the plurality of shielding plates 36 by the connection part 38 facilitates handling. In addition, the number of support parts 34 can be reduced. Furthermore, providing the connection part 38 at the center in a plan view improves symmetry of flow of a source material gas supplied to a growth surface of the single crystal 2.

Gaps G are formed between the plurality of shielding plates 36. Some of the source material gas sublimed from the source material M passes through the gaps G and is supplied to the single crystal 2. Accordingly, the source material gas can be efficiently supplied to the single crystal 2 even if the overall size of the shielding member 30 becomes larger.

The gaps G are covered by parts of the adjacent shielding plates 36, and thus cannot be seen in a plan view. In other words, the plurality of shielding plates 36 are arranged without gaps therebetween in a plan view from the crystal installation part 12.

In the shielding part 32 shown in (c) of FIG. 2, adjacent surfaces 36a of the shielding plates adjacent to each other among the plurality of shielding plates 36 are inclined with respect to a vertical line direction in which a vertical line descends from the crystal installation part 12 to the source material accommodation part 14. Along with this inclination, the gaps G located between the shielding plates 36 adjacent to each other are also inclined with respect to the vertical line direction. Inclinations directions and inclination angles of the gaps G shown in FIG. 2 are all the same. The degree of inclination angle of two side surfaces (one of adjacent surfaces), which form the gaps G, of one shielding plate 36, is arbitrarily selected. For example, adjacent surfaces 36a that face each other may be parallel to each other, but are not limited thereto.

When the gaps G formed by the adjacent surfaces 36a that face each other are inclined, radiation from the source material M onto a growth surface of the single crystal 2 can be curbed. In other words, the influence of radiant heat from the source material M on the growth surface of the single crystal 2 can be reduced. In addition, the gaps G form a flow path of the source material gas. When inclination directions and inclination angles of the gaps G are constant, flow of the source material gas supplied to the single crystal 2 becomes uniform.

Figure 3:
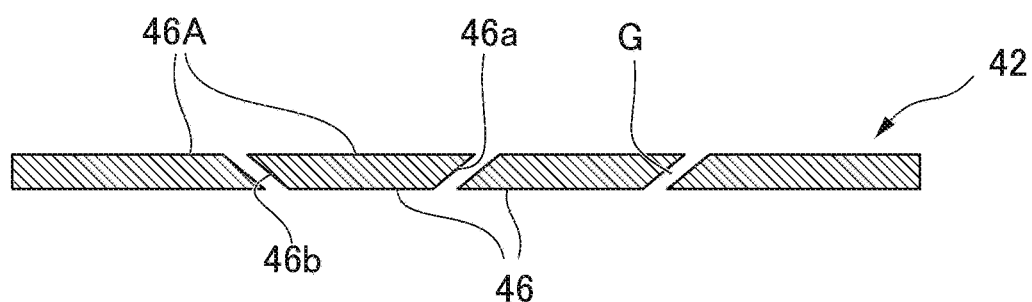
FIG. 3 is a schematic cross-sectional view showing another example of a shielding part in the shielding member according to the first embodiment.
Figure 4:
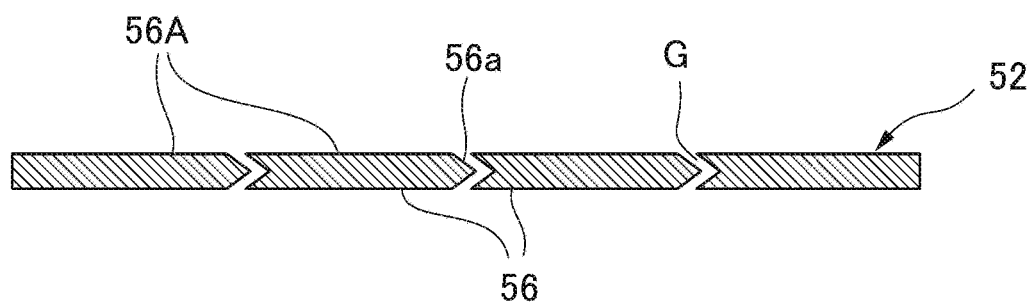
FIG. 4 is a schematic cross-sectional view showing still another example of a shielding part in the shielding member according to the first embodiment.

FIG. 3 and FIG. 4 are views showing another example of the shielding part in the shielding member according to the first embodiment. A shielding part 42 shown in FIG. 3 includes a plurality of shielding plates 46 that have side surfaces (inclined planes) 46a and 46b. Among the plurality of shielding plates 46, shapes of at least some of the shielding plates are different from those of other shielding plates due to an inclination direction of the surfaces 46a and 46b. The shielding part 42 shown in FIG. 3 has a part of which an inclination direction of the adjacent surfaces 46a and 46b that face each other of the shielding plates 46 adjacent to each other is different from that of another part. Along with this difference, an inclination direction of the gaps G located between the shielding plates 36 adjacent to each other becomes different depending on positions of the shielding part 42. Even when an inclination direction of the gaps G becomes different depending on positions, the source material gas can flow through the gaps G. Therefore, it is possible to curb inhibition of flow of the source material gas. At least one of two main surfaces of the shielding plate 46 may have the same shape or different shapes in a plan view. In addition, the adjacent surfaces 46a and 46b that face each other may be parallel to each other, but are not limited thereto.

A shielding part 52 shown in FIG. 4 includes a plurality of shielding plates 56 that have side surfaces. The plurality of shielding plates 52 of FIG. 4 preferably have the same shape. A shape of the side surface viewed from the cross section can be arbitrarily selected, and may be a protruding shape such as a triangle, a semicircle, or an ellipse; or may be a depression shape. In the shielding part 52 shown in FIG. 4, an adjacent surface 56a of an adjacent shielding plate 56 is bent. Along with this bending, the gaps G located between the shielding plates 56 adjacent to each other are also bent. When the gaps G are bent, radiation from the source material M onto a growth surface of the single crystal 2 can be further curbed. In other words, the influence of radiant heat from the source material M on the growth surface of the single crystal 2 can be further reduced. FIG. 4 shows the example in which the gaps G are bent, but the gaps may be curved.

On the plurality of shielding plates 36, 46, and 56 shown in FIG. 2 to FIG. 4, first surfaces 36A, 46A, and 56A on a side of the crystal installation part 12 are located in the same plane. During growth of the single crystal 2, the temperature of the plurality of shielding plates 36, 46, and 56 becomes high. Accordingly, the single crystal 2 also receives radiation from the plurality of shielding plates 36, 46, and 56. When the first surfaces 36A, 46A, and 56A of the shielding plates 36, 46, and 56 are located in the same plane, it is possible to prevent radiant heat received by the single crystal 2 from the shielding plates 36, 46, and 56 from becoming locally high.

As described above, according to the shielding member according to the present embodiment, the source material gas can be efficiently supplied from the source material accommodation part 14 to the crystal installation part 12 via the gaps G. In addition, the plurality of shielding plates 36, 46, and 56 are arranged without gaps therebetween in a plan view so that the gaps G are not visible in a plan view from the crystal installation part 12. Accordingly, radiation from the source material M reaching the growth surface of the single crystal 2 can be curbed, and therefore a temperature difference between the source material M and the growth surface of the single crystal 2 can be generated. In other words, the source material gas sublimed from the source material M can be efficiently supplied to the single crystal 2. Furthermore, the shielding member according to the present embodiment can also be used in a case of crystal growth of a single crystal 2 having a large diameter.

Although one example of the preferred embodiment of the present disclosure has been described in detail above, the present disclosure is not limited to this embodiment, and various modifications and changes are possible within the scope of the present disclosure described in the claims.

Figure 5:
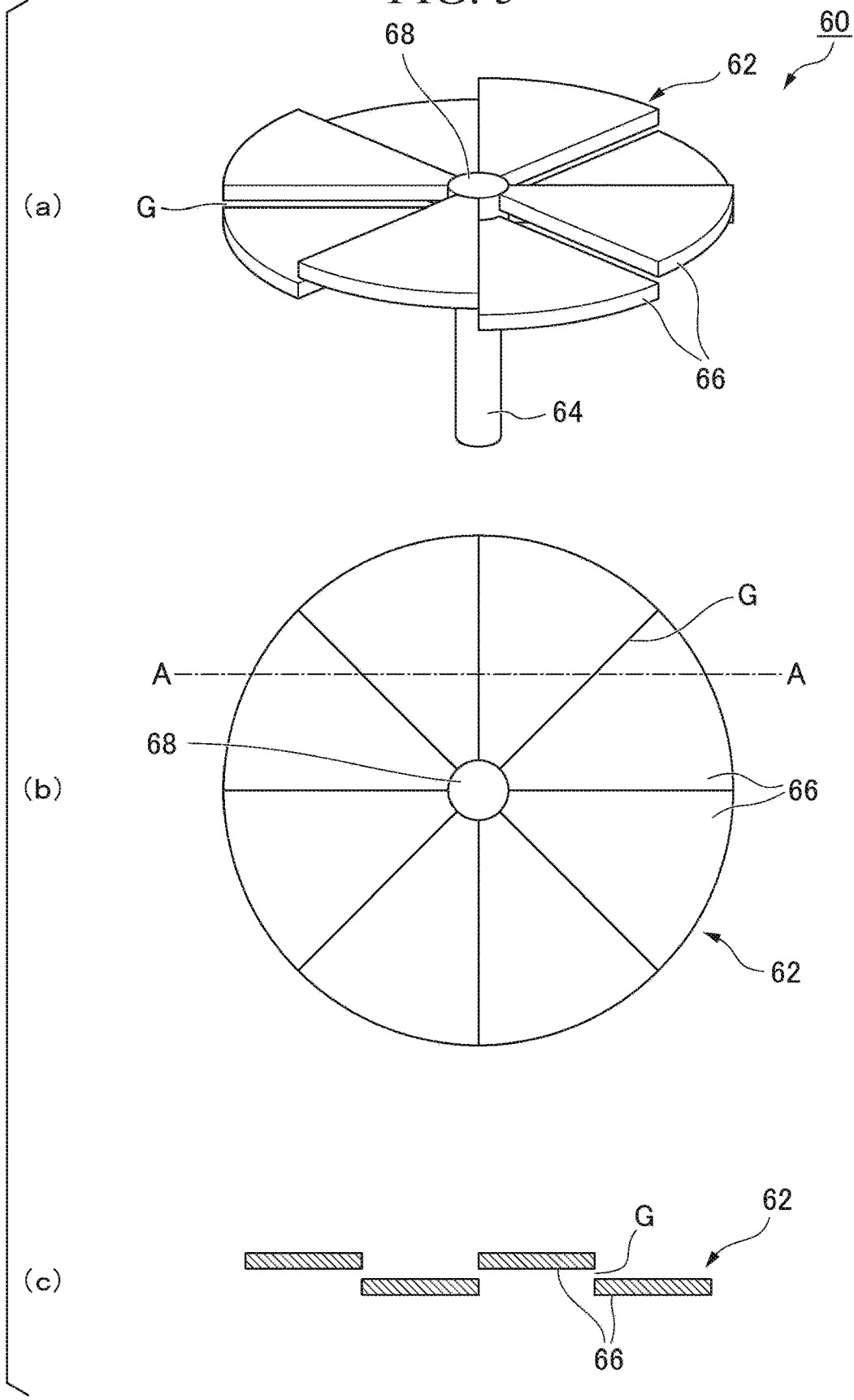
FIG. 5 is a schematic view showing still another example of the shielding member according to the first embodiment.

For example, FIG. 5 is a schematic view of still another example of the shielding member according to the first embodiment. (a) shown in FIG. 5 is a schematic perspective view of a shielding member 60, (b) shown in FIG. 5 is a schematic plan view of a shielding part 62 of the shielding member 60, and (c) shown in FIG. 5 is a schematic cross-sectional view of the shielding part 62 of the shielding member 60 taken along a plane A-A shown in (b) of FIG. 5.

The shielding member 60 shown in FIG. 5 includes a shielding part 62 and a support part 64. The shielding part 62 includes a plurality of shielding plates 66 and a connection part 68 that connects these plates. The support part 64 is connected to the connection part 68 to support the shielding part 62. The shape of the shielding part 62 is different from that of the shielding part 32 shown in FIG. 2.

In the shielding part 62 shown in FIG. 5, a plurality of shielding plates 66 are alternately provided at different height locations. Height locations of the shielding plates 66 adjacent to each other are different, and therefore gaps G are formed between the shielding plates 66 adjacent to each other. The source material gas is efficiently supplied from the source material accommodation part 14 to the crystal installation part 12 via the gaps G. In addition, the plurality of shielding plates 66 are arranged without gaps therebetween in a plan view from the crystal installation part 12. Accordingly, radiation from the source material M reaching the growth surface of the single crystal 2 can be curbed, and therefore a temperature difference between the source material M and the growth surface of the single crystal 2 can be generated. All of the shielding plates 66 may have the same shape, but are not limited to this example. Two side surfaces of each shielding plate 66 are not inclined, and are not limited to this example.

Figure 6:
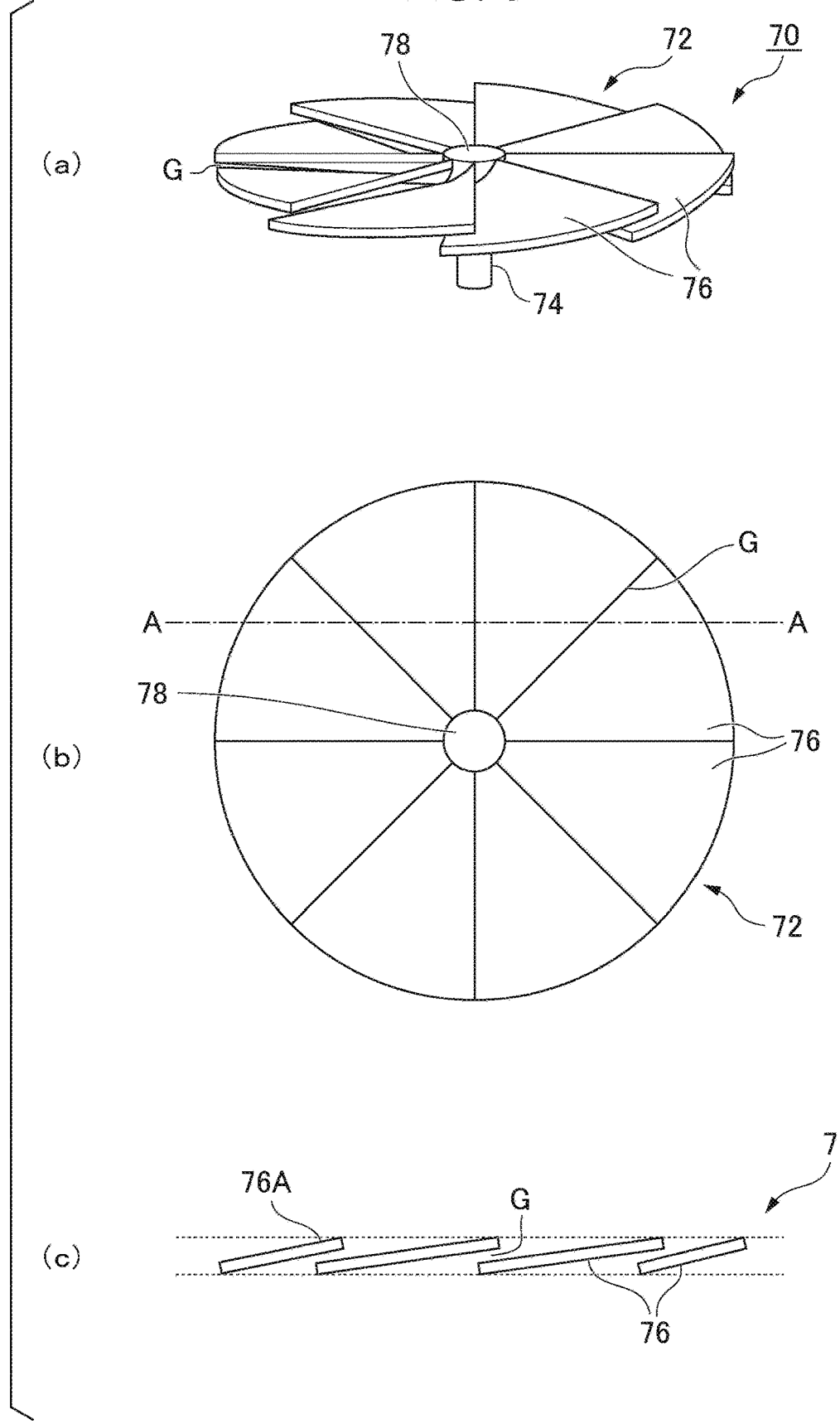
FIG. 6 is a schematic view showing still another example of the shielding member according to the first embodiment.

In addition, for example, FIG. 6 is a schematic view of still another example of the shielding member according to the first embodiment. (a) shown in FIG. 6 is a schematic perspective view of a shielding member 70, (b) shown in FIG. 6 is a schematic plan view of a shielding part 72 of the shielding member 70, and (c) shown in FIG. 6 is a schematic cross-sectional view of the shielding part 72 of the shielding member 70 taken along a plane A-A shown in (b) of FIG. 6.

The shielding member 70 shown in FIG. 6 includes a shielding part 72 and a support part 74. The shielding part 72 includes a plurality of shielding plates 76 and a connection part 78 that connects these plates. The support part 74 is connected to the connection part 78 to support the shielding part 72. A shape of the shielding part 72 is different from that of the shielding part 32 shown in FIG. 2.

The plurality of shielding plates 76 constituting the shielding part 72 shown in FIG. 6 are inclined with respect to an in-plane direction that is orthogonal to a vertical line in which the vertical line is dropped from the crystal installation part 12 to the source material accommodation part 14. The shielding part 72 shown in FIG. 6 has a propeller-like shape and has a plurality of shielding plates 76 as wings. A first surface 76A (a dotted line on an upper side shown in (c)) which connects end parts on a side of the crystal installation part 12 of each shielding plate 76 is preferably parallel to a surface orthogonal to a vertical line in which the vertical line is dropped from the crystal installation part 12 to the source material accommodation part 14.

Gaps G are formed between the plurality of shielding plates 76. The source material gas is efficiently supplied from the source material accommodation part 14 to the crystal installation part 12 via the gaps G. The source material gas may be blown to the crystal installation part 12 by rotating the plurality of shielding plates 76 which have a propeller-like shape. In addition, the plurality of shielding plates 76 are arranged without gaps therebetween in a plan view from the crystal installation part 12. Accordingly, radiation from the source material M reaching the growth surface of the single crystal 2 can be curbed, and therefore a temperature difference between the source material M and the growth surface of the single crystal 2 can be generated.

Figure 7:
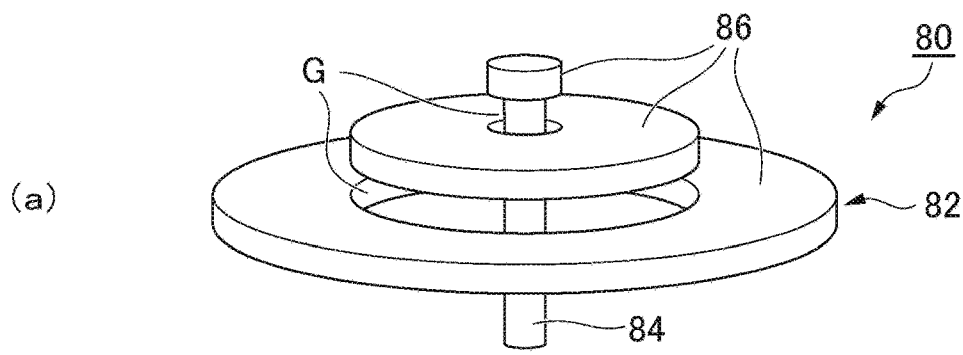
FIG. 7 is a schematic view showing still another example of the shielding member according to the first embodiment.
Figure 7:
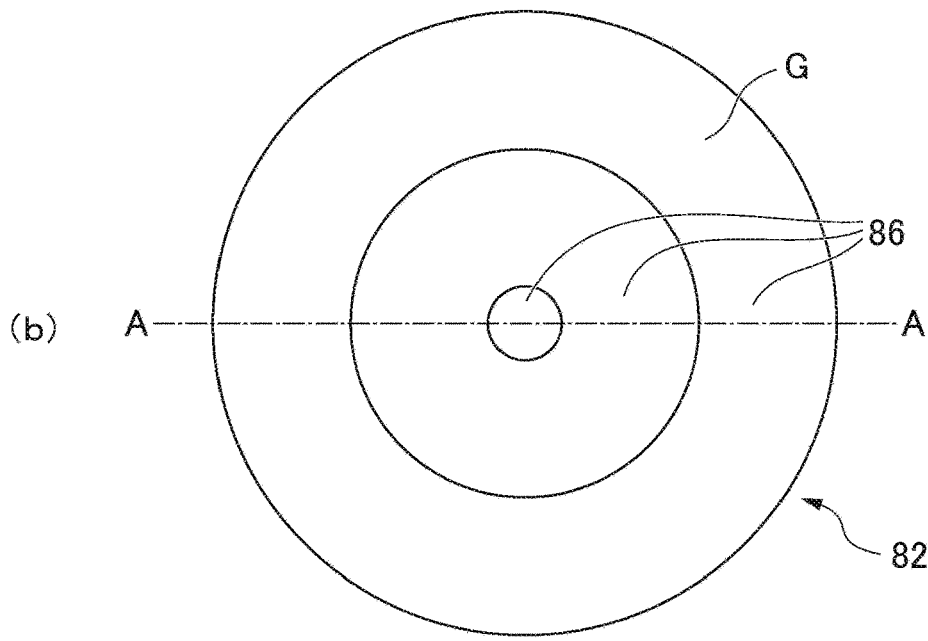
Figure 7:
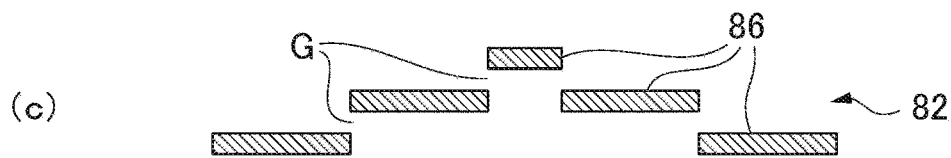

In addition, for example, FIG. 7 is a schematic view of still another example of the shielding member according to the first embodiment. (a) shown in FIG. 7 is a schematic perspective view of a shielding member 80, (b) shown in FIG. 7 is a schematic plan view of a shielding part 82 of the shielding member 80, and (c) shown in FIG. 7 is a schematic cross-sectional view of the shielding part 82 of the shielding member 80 taken along a plane A-A shown in (b) of FIG. 7.

The shielding member 80 shown in FIG. 7 includes a shielding part 82 and a support part 84. The shielding part 82 has a plurality of shielding plates 86. The support part 84 is connected to each of the plurality of shielding plates 86. The shape of the shielding part 82 is different from that of the shielding part 32 shown in FIG. 2.

The plurality of shielding plates 86 constituting the shielding part 82 shown in FIG. 7 are arranged concentrically in a plan view from the crystal installation part 12. Each of the shielding plates 86 is provided at a different height location. Two shielding plates 86 on an outer side have a donut shape in a plan view. Height locations of the shielding plates 86 adjacent to each other are different, and therefore gaps G are formed between the shielding plates 86 adjacent to each other. The source material gas is efficiently supplied from the source material accommodation part 14 to the crystal installation part 12 via the gaps G. In addition, the plurality of shielding plates 66 are arranged without gaps therebetween in a plan view from the crystal installation part 12. Accordingly, radiation from the source material M reaching the growth surface of the single crystal 2 can be curbed, and therefore a temperature difference between the source material M and the growth surface of the single crystal 2 can be generated. Furthermore, in FIG. 7, as a location of the shielding plate 86 becomes closer to the center, the shielding plate 86 is provided at a higher location, but height locations of the shielding plates 86 are not limited thereto.

In addition, the case in which the number of support parts that support a shielding part is one has been described above as an example, but a support part may be provided for each shielding plate.

As described above, according to the present disclosure, it is possible to provide a shielding member by which inhibition of flow of a source material gas can be curbed, and by which a temperature difference between a source material surface and a growth surface can be generated; and an apparatus for growing single crystals which includes this shielding member.

EXPLANATION OF REFERENCES

1: Seed crystal
2: Single crystal
10: Container for crystal growth
12: Crystal installation part
14: Source material accommodation part
20: Coil
30, 60, 70, 80: Shielding member
32, 42, 52, 62, 72, 82: Shielding part
34, 64, 74, 84: Support part
36, 46, 56, 66, 76, 86: Shielding plate
36a, 46a, 46b, 56a: Adjacent surface
36A, 46A, 56A, 76A: First surface
38, 68, 78: Connection part
100: Apparatus for growing single crystals
M: Source material
G: Gap

What is claimed is:

1. A shielding member, comprising:
   a plurality of shielding plates,
   wherein the plurality of shielding plates are arranged without gaps therebetween in a plan view from a crystal installation part, and
   wherein the shielding member is disposed between a source material accommodation part and the crystal installation part, in an apparatus for growing single crystals,
   the apparatus for growing single crystals comprising:
   a container for crystal growth that includes the source material accommodation part at an inner bottom part, and the crystal installation part that faces the source material accommodation part, and
   a heating part that is configured to heat the container for crystal growth,
   in which a single crystal of a source material is grown on a crystal installed in the crystal installation part by subliming the source material from the source material accommodation part,
   adjacent surfaces of shielding plates which are adjacent to each other among the plurality of shielding plates are inclined with respect to a direction of a vertical line in which the vertical line is dropped from the crystal installation part to the source material accommodation part, and
   gaps located between the shielding plates adjacent to each other are inclined with respect to the direction of the vertical line.

2. The shielding member according to claim 1, further comprising a connection part that connects together the plurality of shielding plates and a support part that supports the connection part.

3. The shielding member according to claim 2, wherein the connection part is located at a center of the source material accommodation part in a plan view.

4. A shielding member, comprising:
a plurality of shielding plates,
wherein the plurality of shielding plates are arranged without gaps there between in a plan view from a crystal installation part, and
wherein the shielding member is disposed between a source material accommodation part and the crystal installation part, in an apparatus for growing single crystals,
the apparatus for growing single crystals comprising:
a container for crystal growth that includes the source material accommodation part at an inner bottom part, and the crystal installation part that faces the source material accommodation part, and
a heating part that is configured to heat the container for crystal growth,
in which a single crystal of a source material is grown on a crystal installed in the crystal installation part by subliming the source material from the source material accommodation part,
wherein surfaces, which are on a side of the crystal installation part, of the plurality of shielding plates are located in the same plane.

5. An apparatus for growing single crystals, comprising the shielding member according to claim 1.

6. The apparatus for growing single crystals according to claim 5, further comprising a connection part that connects the plurality of shielding plates and a support part that supports the connection part.

7. The apparatus for growing single crystals according to claim 6, wherein the connection part is located at a center of the source material accommodation part in a plan view.

8. The shielding member according to claim 4, further comprising a connection part that connects together the plurality of shielding plates and a support part that supports the connection part.

9. The shielding member according to claim 8, wherein the connection part is boated at a center of the source material accommodation part in a plan view.

10. The shielding member according to claim 4,
wherein adjacent surfaces of shielding plates which are adjacent to each other among the plurality of shielding plates are bent or curved, and
gaps located between the shielding plates adjacent to each other are bent or curved.

11. An apparatus for growing single crystals, comprising the shielding member according to claim 6.

12. The apparatus for growing single crystals according to claim 11, further comprising a connection part that connects the plurality of shielding plates and a support part that supports the connection part.

13. The apparatus for growing single crystals according to claim 12, wherein the connection part is located at a center of the source material accommodation part in a plan view.

14. The apparatus for growing single crystals according to claim 11,
wherein adjacent surfaces of shielding plates which are adjacent to each other among the plurality of shielding plates are bent or curved, and
gaps located between the shielding plates adjacent to each other are bent or curved.

* * * * *